(12) United States Patent
Sui et al.

(10) Patent No.: US 11,860,461 B2
(45) Date of Patent: Jan. 2, 2024

(54) DISPLAY PANEL AND METHOD FOR MANUFACTURING THE SAME

(71) Applicant: BOE TECHNOLOGY GROUP CO., LTD., Beijing (CN)

(72) Inventors: Kai Sui, Beijing (CN); Qian Jin, Beijing (CN); Jinxiang Xue, Beijing (CN); Wei Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 708 days.

(21) Appl. No.: 16/966,697

(22) PCT Filed: Oct. 17, 2019

(86) PCT No.: PCT/CN2019/111722
§ 371 (c)(1),
(2) Date: Jul. 31, 2020

(87) PCT Pub. No.: WO2021/072707
PCT Pub. Date: Apr. 22, 2021

(65) Prior Publication Data
US 2023/0091595 A1    Mar. 23, 2023

(51) Int. Cl.
G02F 1/133 (2006.01)
G02F 1/1333 (2006.01)
H10K 59/12 (2023.01)
H10K 59/122 (2023.01)
H10K 59/38 (2023.01)
G02F 1/1335 (2006.01)

(52) U.S. Cl.
CPC ... *G02F 1/133354* (2021.01); *H10K 59/1201* (2023.02); *H10K 59/122* (2023.02); *H10K 59/38* (2023.02); *G02F 1/133614* (2021.01); *G02F 2201/07* (2013.01)

(58) Field of Classification Search
CPC .................. H10K 59/1201; G02F 1/133354
USPC .......................................................... 349/42
See application file for complete search history.

(56) References Cited

U.S. PATENT DOCUMENTS 10,833,289 B2 * 11/2020 Ma ..................... H10K 71/00
2002/0057413 A1    5/2002 Sumida et al.
(Continued)

FOREIGN PATENT DOCUMENTS

CN         1761983 A      4/2006
CN       102999226 A      3/2013
(Continued)

OTHER PUBLICATIONS

European Extended Search Report, Application No. 19944646.9, dated Jun. 13, 2022, 9 pps.
(Continued)

*Primary Examiner* — Christopher M Raabe
(74) *Attorney, Agent, or Firm* — Armstrong Teasdale LLP

(57) ABSTRACT

The present disclosure relates to a display panel. The display panel includes a display substrate, an opposite substrate, and a first adhesive layer and light guide layer located between the display substrate and the opposite substrate and stacked on each other. The first adhesive layer includes a photocured layer formed by curing a photocurable material layer. And the light guide layer is used to direct light to the photocurable material layer during the curing to form the cured layer.

20 Claims, 8 Drawing Sheets

(56) References Cited

U.S. PATENT DOCUMENTS

| | | | |
|---|---|---|---|
| 2011/0242467 A1* | 10/2011 | Kim | G02F 1/133308 |
| | | | 349/113 |
| 2013/0308076 A1 | 11/2013 | Yasumatsu | |
| 2015/0212370 A1* | 7/2015 | Harayama | G02F 1/133602 |
| | | | 349/42 |
| 2015/0355485 A1 | 12/2015 | Zhang | |
| 2016/0221306 A1 | 8/2016 | Uriu et al. | |
| 2018/0157090 A1 | 6/2018 | Kim et al. | |
| 2021/0336171 A1* | 10/2021 | Peng | H10K 50/865 |

FOREIGN PATENT DOCUMENTS

| | | | |
|---|---|---|---|
| CN | 103853372 A | | 6/2014 |
| CN | 104035255 A | | 9/2014 |
| CN | 105445994 A | | 3/2016 |
| CN | 106154636 A | | 11/2016 |
| CN | 106663721 A | | 5/2017 |
| CN | 108153014 A | | 6/2018 |
| CN | 108459437 A | | 8/2018 |
| CN | 108845454 A | | 11/2018 |
| CN | 109557699 A | | 4/2019 |
| JP | 1153918 A | | 2/1999 |
| JP | 2004342236 A | | 12/2004 |
| JP | 2009193884 A | | 8/2009 |
| JP | 2015013472 A | | 1/2015 |
| JP | 2016094530 A | | 5/2016 |
| JP | 2017021297 A | | 1/2017 |
| TW | 201941457 A | | 10/2019 |
| WO | 2012042803 A1 | | 4/2012 |
| WO | 2016204166 A1 | | 12/2016 |
| WO | WO-2021049474 A1 * | | 3/2021 |

OTHER PUBLICATIONS

China First Office Action, Application No. 201980002026.0, dated Jan. 14, 2022, 20 pps.: with English translation.

China Second Office Action, Application No. 201980002026.0, dated Sep. 15, 2022, 19 pps.: with English translation.

PCT International Search Report, Application No. PCT/CN2019/111722, dated Jul. 15, 2020, 8 pages: with English translation.

PCT Written Opinion, Application No. PCT/CN2019/111722, dated Jul. 15, 2020, 7 pages.: with English translation of relevant part.

JP Notice of Reasons for Refusal, Application No. 2021-563680, dated Jun. 27, 2023, 12 pps.: with English translation.

* cited by examiner

DISPLAY PANEL AND METHOD FOR MANUFACTURING THE SAME

CROSS REFERENCE TO RELATED APPLICATIONS

This patent application is a National Stage Entry of PCT/CN2019/111722 filed on Oct. 17, 2019, the disclosure of which is incorporated by reference herein in its entirety as part of the present application.

BACKGROUND

Embodiments of the present disclosure relate to a field of displaying technology, in particular, to a display panel and a method for manufacturing the same.

Quantum Dot Light Emitting Diode (QLED) display panel is a new technology that can replace Organic Light Emitting Diode (OLED) display panel in the future. QLED display panels have the advantages of wide color gamut, high brightness, bright color, low cost, and strong stability.

BRIEF DESCRIPTION

Embodiments of the present disclosure provide a display panel and a method for manufacturing the same.

One aspect of the present disclosure provides a display panel. The display panel includes a display substrate, an opposite substrate, and a first adhesive layer and light guide layer located between the display substrate and the opposite substrate and stacked on each other. The first adhesive layer includes a photo-cured layer formed by curing a photocurable material layer. The light guide layer is used to direct light to the photocurable material layer during the curing to form the photo-cured layer.

In an exemplary embodiment of the present disclosure, the light guide layer includes a plurality of openings. Each opening of the light guide layer is located within a corresponding one of light emitting regions of the display panel, respectively.

In an exemplary embodiment of the present disclosure, the opening of the light guide layer is filled with a transparent resin or a material of the first adhesive layer. A refractive index of the transparent resin and a refractive index of the material of the first adhesive layer are less than a refractive index of the light guide layer.

In an exemplary embodiment of the present disclosure, a surface of the light guide layer away from the first adhesive layer has at least one of a recess and a protrusion.

In an exemplary embodiment of the present disclosure, the display panel further includes a second adhesive layer located on a side of the light guide layer away from the first adhesive layer. A refractive index of the second adhesive layer and a refractive index of the first adhesive layer are less than a refractive index of the light guide layer.

In an exemplary embodiment of the present disclosure, the display panel further includes a first cladding layer located between the light guide layer and the first adhesive layer, and a second cladding layer located between the light guide layer and the second adhesive layer. A refractive index of the first cladding layer is less than a refractive index of the first adhesive layer and a refractive index of the second cladding layer is less than the refractive index of the second adhesive layer.

In an exemplary embodiment of the present disclosure, the light guide layer is located on a side of the first adhesive layer facing the display substrate.

In an exemplary embodiment of the present disclosure, the light guide layer is located on a side of the first adhesive layer facing the opposite substrate.

In an exemplary embodiment of the present disclosure, materials of the first cladding layer and the second cladding layer include epoxy resin, polymethyl methacrylate, or silica gel.

In an exemplary embodiment of the present disclosure, a material of the light guide layer includes propylene, polystyrene, ethylene-propylene copolymer, polycarbonate, poly(ethylene terephthalate), polyvinyl chloride, polyethylene resin, polyamide resin, or rubber resin.

In an exemplary embodiment of the present disclosure, a material of the first adhesive layer includes an ultraviolet curable material.

In an exemplary embodiment of the present disclosure, the ultraviolet curable material includes formate ester or carboxylic ester.

In an exemplary embodiment of the present disclosure, the opposite substrate includes a first substrate, a black matrix located on a side of the first substrate facing the display substrate for defining light emitting region of the display panel, and a color block located on the side of the first substrate facing the display substrate and located within the light emitting region.

In an exemplary embodiment of the present disclosure, the light emitting region includes a first sub-light emitting region, a second sub-light emitting region, and a third sub-light emitting region. The color block includes a red color block located within the first sub-light emitting region, a green color block located within the second sub-light emitting region, and a blue color block located within the third sub-light emitting region. The red color block includes a red color film located on the first substrate and a red quantum dot layer located on the red color film. The green color block includes a green color film located on the first substrate and a green quantum dot layer located on the green color film. The blue color block includes a blue color film located on the first substrate and a scattering particle layer located on the blue color film.

In an exemplary embodiment of the present disclosure, the display substrate includes a second substrate, a thin film transistor located on a side of the second substrate facing the opposite substrate, a pixel definition layer located on the thin film transistor. The pixel definition layer has openings. Each opening of the pixel definition layer is located within a corresponding one of the light emitting regions. The display substrate further includes a first light emitting device located on the thin film transistor and located in each opening of the pixel definition layer, and an encapsulation layer located on the pixel definition layer and the first light emitting device.

In an exemplary embodiment of the present disclosure, the display substrate includes a third substrate and a fourth substrate disposed oppositely, a liquid crystal layer located between the third substrate and the fourth substrate, a first alignment layer located on a side of the third substrate facing the liquid crystal layer, a second alignment layer located on a side of the fourth substrate facing the liquid crystal layer, a pixel electrode located between the third substrate and the first alignment layer and located within the light emitting region of the display panel, a thin film transistor located between the third substrate and the pixel electrode, and a dielectric layer located between the third substrate and the pixel electrode and a common electrode located between a second electrode and the dielectric layer, or a common electrode located between the fourth substrate and the second alignment layer.

One aspect of the present disclosure provides a method for manufacturing a display panel. The method includes providing a display substrate and an opposite substrate, providing one of light guide layer and a first adhesive layer including a photocurable material on the display substrate or the opposite substrate, providing the other of the light guide layer and the first adhesive layer on the display substrate or the opposite substrate, joining the display substrate and the opposite substrate so that the light guide layer and the first adhesive layer are located between the display substrate and the opposite substrate and are stacked on each other, and directing light from a side face of the light guide layer into the light guide layer to cure the photocurable material included in the first adhesive layer, thereby forming a photo-cured layer. The side face is located between a first face and a second face opposite to each other of the light guide layer that are parallel to a display side of the display panel.

In an exemplary embodiment of the present disclosure, providing one of light guide layer and a first adhesive layer including a photocurable material on the display substrate or the opposite substrate and providing the other of the light guide layer and the first adhesive layer on the display substrate or the opposite substrate includes providing the light guide layer on the display substrate, and providing the first adhesive layer including the photocurable material on the light guide layer.

In an exemplary embodiment of the present disclosure, providing one of light guide layer and a first adhesive layer including a photocurable material on the display substrate or the opposite substrate includes providing the first adhesive layer including the photocurable material on the display substrate. Providing the other of the light guide layer and the first adhesive layer on the display substrate or the opposite substrate includes providing the light guide layer on the opposite substrate.

In an exemplary embodiment of the present disclosure, the light guide layer includes openings. Each opening of the light guide layer is located within a corresponding one of the light emitting regions of the display panel, respectively.

In an exemplary embodiment of the present disclosure, the method further includes, after providing the light guide layer, filling the opening of the light guide layer with a transparent resin or a material of the first adhesive layer. A refractive index of the transparent resin and a refractive index of the material of the first adhesive layer are less than a refractive index of the light guide layer.

In an exemplary embodiment of the present disclosure, a surface of the light guide layer away from the first adhesive layer has at least one of a recess and a protrusion.

In an exemplary embodiment of the present disclosure, the method further includes before providing the light guide layer, providing a second adhesive layer on the display substrate or the opposite substrate. A refractive index of the first adhesive layer and a refractive index of the second adhesive layer are less than a refractive index of the light guide layer.

In an exemplary embodiment of the present disclosure, the method further includes before providing the light guide layer, forming a first cladding layer and a second cladding layer on both sides of the light guide layer, respectively. The light guide layer is provided such that the first cladding layer is located between the light guide layer and the first adhesive layer and the second cladding layer is located between the light guide layer and the second adhesive layer. A refractive index of the first cladding layer is less than a refractive index of the first adhesive layer, and a refractive index of the second cladding layer is less than a refractive index of the second adhesive layer.

Adaptive and further aspects and scope will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several views of the drawings.

DETAILED DESCRIPTION

Figure 1:
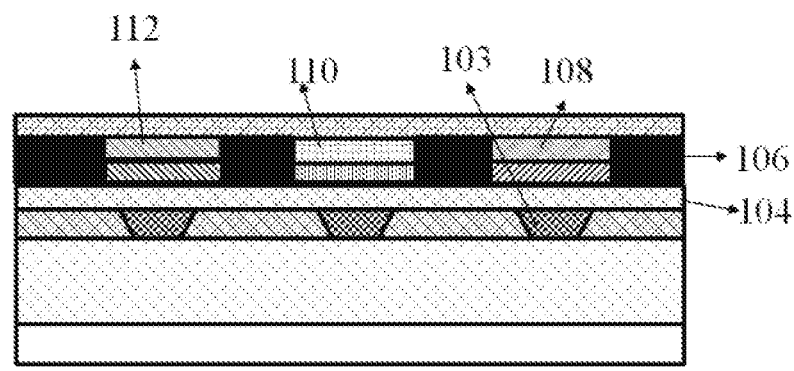
FIG. 1 shows a schematic diagram of a cross-sectional structure of an OLED display panel obtained by a thin film encapsulation method.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. The term "example" used herein, particularly when followed by a listing of terms, is merely exemplary and illustrative and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

In addition, in the drawings, the thickness and area of each layer are exaggerated for clarity. It should be understood that when a layer, a region, or a component is referred to as being "on" another part, it is meant that it is directly on the another part, or there may be other components in between. In contrast, when a certain component is referred to as being "directly" on another component, it is meant that no other component lies in between.

The flow diagrams depicted herein are just one example. There may be many variations to this diagram or the steps (or operations) described therein without departing from the spirit of the disclosure. For instance, the steps may be performed in a differing order or steps may be added, deleted, or modified. All of these variations are considered a part of the claimed disclosure.

Exemplary embodiments will now be described more fully with reference to the accompanying drawings.

At present, the light source of the OLED display panel mainly adopts blue OLED or blue light emitting diode (LED), and the displaying is realized by illuminating red and green quantum dots with different diameters by using blue backlight source. The encapsulation of the OLED display panel can be achieved by a thin film encapsulation method or a method of joining a thin film transistor (TFT) substrate and a cover substrate.

FIG. 1 shows a schematic diagram of a cross-sectional structure of an OLED display panel obtained by a thin film encapsulation method. When the thin film encapsulation method is used for encapsulation, after the thin film encapsulation layer 104 is formed, a water washing process for forming the color filter films 108, 110, or 112 and the black matrix 106 needs to be further performed. This water washing process will damage the thin film encapsulation layer 104 and the light emitting layer of the OLED light emitting device 103, thereby reducing the yield of the product.

Figure 2A:
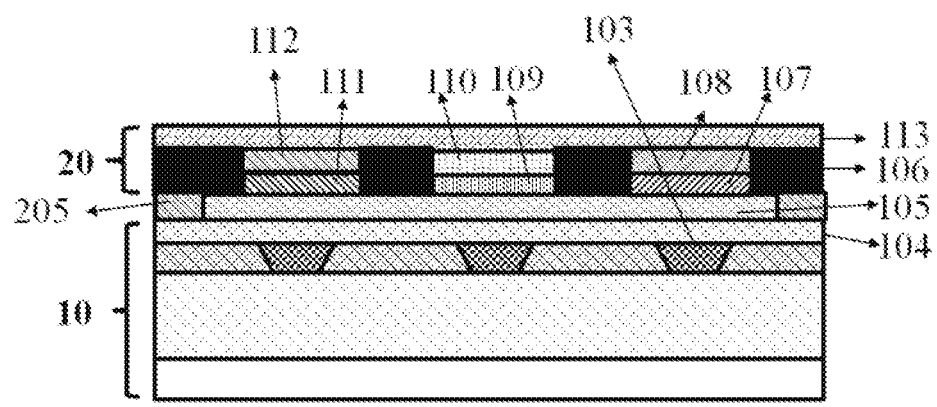
FIGS. 2A and 2B show schematic diagrams of a cross-sectional structure and a planar structure of an OLED display panel obtained by a joining method.
Figure 2B:
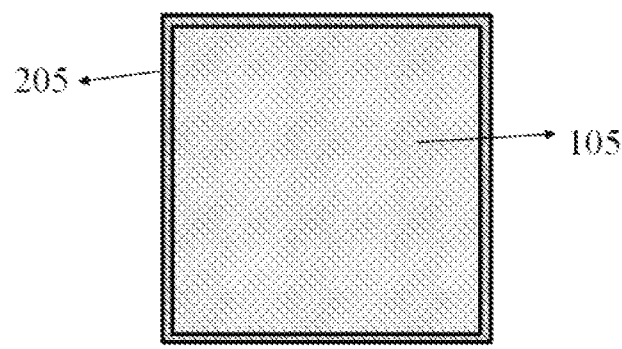

FIGS. 2A and 2B show schematic diagrams of a cross-sectional structure and a planar structure of an OLED display panel obtained by a joining method. When the method of joining the TFT substrate 10 and the cover substrate 20 for encapsulation is performed, since the TFT substrate 10 including the thin film encapsulation layer 104 and the light emitting layer of the OLED light emitting device 103 and the cover substrate 20 including the color filter films 108, 110, or 112 and the black matrix 106 are formed separately, the process for forming the color filter film 108, 110, or 112 and the black matrix 106 would not damage the thin film encapsulation layer 104 and the light emitting layer of the OLED light emitting device 103 of the TFT substrate 10. In addition, when using this joining method for encapsulation, it is necessary to further provide a dam (DAM) glue 205 and a filling glue 105 located within the region enclosed by the dam glue 205 between the TFT substrate 10 and the cover substrate 20 (as shown in FIG. 2B), so as to block water and oxygen. In addition, the use of the dam glue 205 and the filling glue 105 can also support the TFT substrate 10 and the cover substrate 20, thereby preventing the pressure applied when joining the TFT substrate 10 and the cover substrate 20 from damaging the light emitting layer or TFT.

Figure 3A:
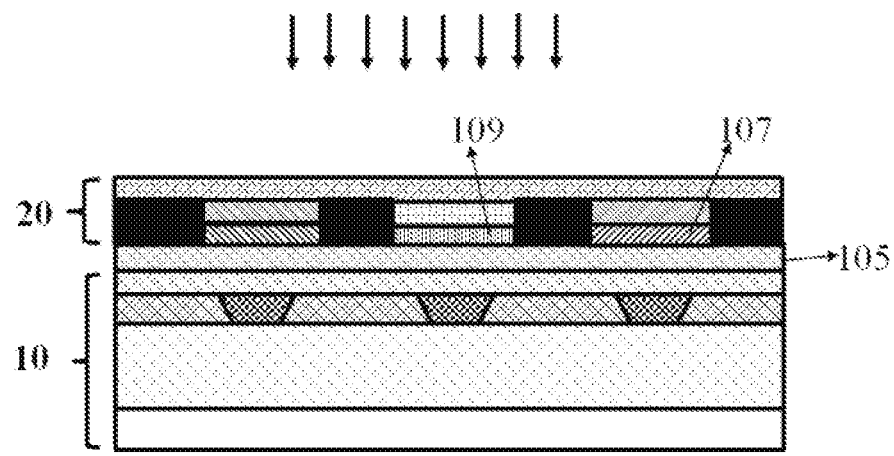
FIGS. 3A and 3B show schematic diagrams of cross-sectional structures of an OLED display panel obtained by a joining method.
Figure 3B:
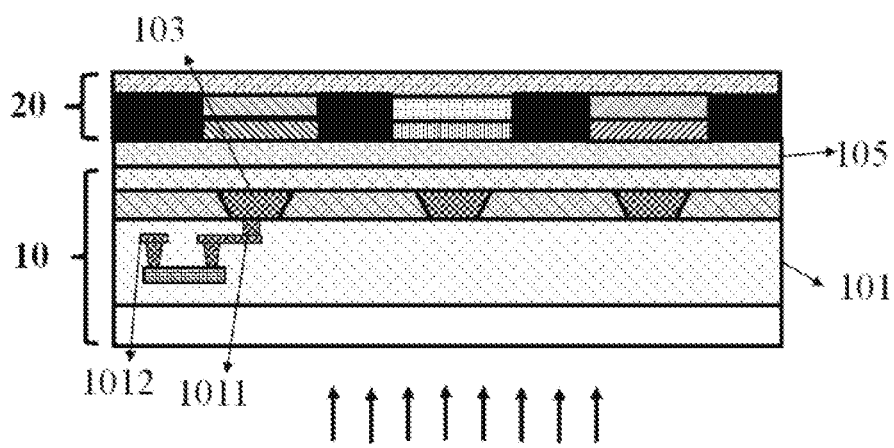

The above joining method usually requires further curing of the filling glue. However, this curing has potential problems. Specifically, in the case of using ultraviolet (UV) light to cure the filling glue, when UV light is directed from the cover substrate 20 side to cure the filling glue 105 (as shown in FIG. 3A), the quantum dot material in the quantum dot layers 107, 109 has a strong light absorption effect on UV light, so that UV light cannot reach the filling glue 105 which thus cannot be cured. When UV light is directed from the TFT substrate 10 side to cure the filling glue 105 (as shown in FIG. 3B), UV light adversely degrades the performance of the TFT 101 and the source/drain electrodes 1011/1012 of the TFT 101 or the anode of the light emitting device 103 have a reflection effect on UV light, so that UV light cannot reach the filling glue 105, which causes difficulty in curing the filling glue 105. In the case of curing the filling glue using a thermal curing method, the curing temperature of the filling glue currently used for encapsulation is usually greater than 100° C. If it is lower than this temperature, the cured filling glue will be unstable, which will seriously affect the encapsulation effect. However, the higher curing temperature will seriously reduce the luminous efficiency of OLED light emitting device and quantum dot materials.

The embodiments of the present disclosure provide a display panel and a method for manufacturing the same, so that during the process of manufacturing the display panel, in the case of ensuring effective curing of the photocurable material layer, other devices of the display panel will not be damaged, thereby not only providing a good encapsulation effect but also does not adversely affect the display panel.

Figure 4:
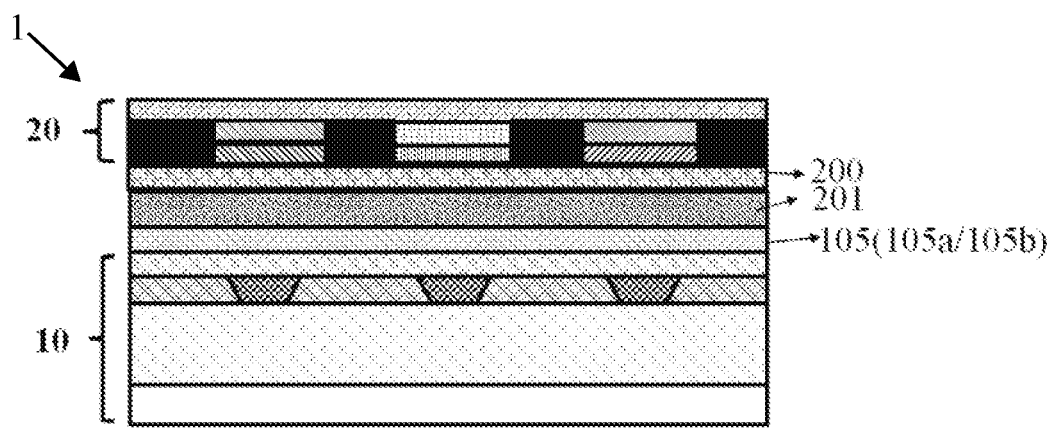
FIG. 4 shows a schematic diagram of a cross-sectional structure of a display panel according to an embodiment of the present disclosure.

FIG. 4 shows a schematic diagram of a cross-sectional structure of a display panel according to an embodiment of the present disclosure. As shown in FIG. 4, the display panel 1 includes a display substrate 10, an opposite substrate 20, and a first adhesive layer 105 and light guide layer 201 located between the display substrate 10 and the opposite substrate 20 and stacked on each other.

In an embodiment of the present disclosure, the first adhesive layer 105 includes, for example, a photo-cured layer 105b formed by curing a photocurable material layer 105a (for example, the filling glue as described above) during the manufacturing process of the display panel. According to an embodiment of the present disclosure, due to the presence of the light guide layer, light is directed into the light guide layer 201 from the side of the light guide layer 201 during curing of the photocurable material of the first adhesive layer, passes through the light guide layer 201 and propagates, along the joining interface between the display substrate and the opposite substrate, to the photocurable material layer 105a which is thus cured, thereby obtaining the photo-cured layer 105b. Therefore, the joining between the display substrate 10 and the opposite substrate 20 is achieved.

In addition, during the joining between the display substrate 10 and the opposite substrate 20, since the light is directly directed from the side of the display panel through the light guide layer to the photocurable material layer of the first adhesive layer without passing through other layers of the display panel, the photocuring process would not adversely affect other layers of the display panel, for example, would not degrade the electrical performance of the thin film transistor 101 of the display substrate 10. In addition, since the light for curing is directed from the side of the display panel, it will not be attenuated by being absorbed or reflected by the structure in the display substrate 10 and the opposite substrate 20 before propagating to the photocurable material layer.

In an exemplary embodiment of the present disclosure, a material of the light guide layer 201 may include propylene, polystyrene, ethylene-propylene copolymer, polycarbonate, poly (ethylene terephthalate), polyvinyl chloride, polyethylene resin, polyamide resin, or rubber resin.

In an embodiment of the present disclosure, the first adhesive layer 105 may include an ultraviolet curable material. As an example, the ultraviolet curable material may include formate ester, acrylic ester, or carboxylate. It should be understood that, according to actual needs, the embodiments of the present disclosure may also use photocurable materials whose sensitive wavelengths are different from ultraviolet light.

In an exemplary embodiment of the present disclosure, the light guide layer may include a plurality of openings. Each opening of the light guide layer is located within a corresponding one of light emitting regions of the display panel, respectively.

Figure 5A:
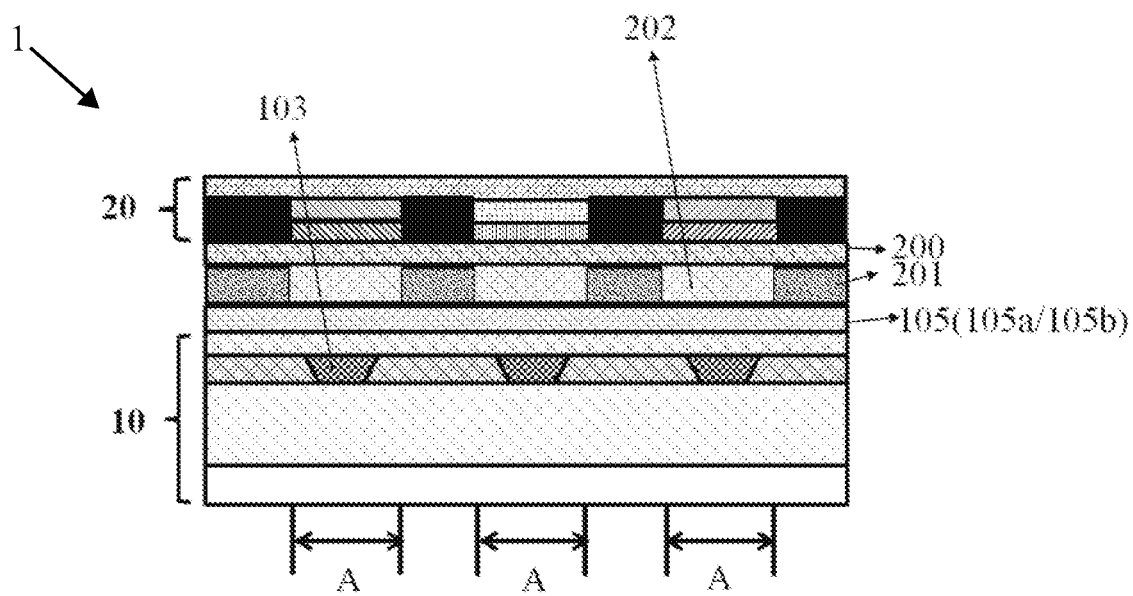
FIG. 5A shows a schematic diagram of a cross-sectional structure of a display panel according to an embodiment of the present disclosure.
Figure 5B:
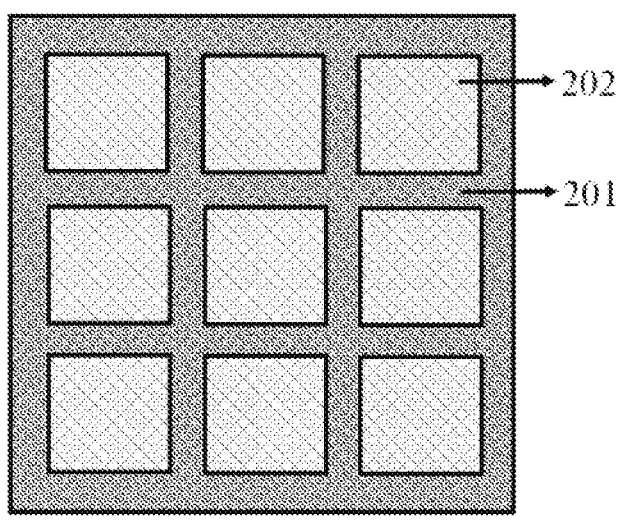
FIG. 5B shows a schematic plan diagram of light guide layer according to an embodiment of the present disclosure.

FIG. 5A shows a schematic diagram of a cross-sectional structure of a display panel according to an embodiment of the present disclosure. FIG. 5B shows a schematic plan diagram of light guide layer according to an embodiment of the present disclosure. Referring to FIGS. 5A and 5B, the light guide layer 201 may include openings 202. In an embodiment of the present disclosure, each opening 202 is located within a corresponding one of the light emitting regions A of the display panel 1, respectively.

In an embodiment of the present disclosure, the opening 202 is provided so that the light guide layer 201 does not affect the propagation direction of the light emitted by the light emitting device 103 in the display substrate 10 during displaying. That is, the opening 202 allows the light emitted by the light emitting device 103 to propagate in each light emitting region A without affecting the light emission in the adjacent light emitting region A, thereby avoiding color crosstalk between the light emitting regions A and improving the display effect.

In an exemplary embodiment of the present disclosure, a surface of the light guide layer away from the first adhesive layer has at least one of a recess and a protrusion.

Figure 6A:
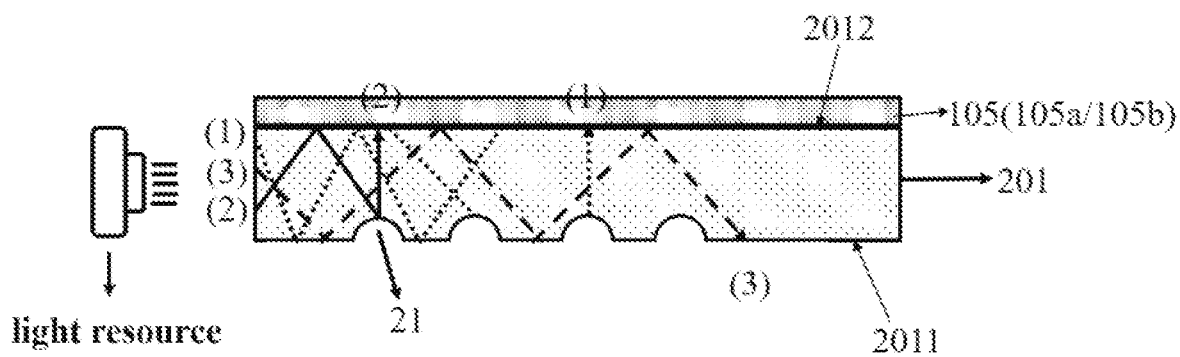
FIG. 6A shows a schematic diagram of a cross-sectional structure of light guide layer with recesses according to an embodiment of the present disclosure.

FIG. 6A shows a schematic diagram of a cross-sectional structure of light guide layer with recesses according to an embodiment of the present disclosure. It should be noted that the structure of FIG. 6A is based on the light guide layer in the structure of FIG. 4.

As shown in FIG. 6A, the surface 2011 of the light guide layer 201 away from the first adhesive layer 105 has recesses 21. In an embodiment of the present disclosure, during the manufacturing of the display panel, the recess 21 can guide the light propagating within the light guide layer 201 to exit from the surface 2012 of the light guide layer 201 close to the photocurable material layer 105a, thereby curing the photocurable material layer 105a to form the photo-cured layer 105b. For example, in FIG. 6A, the light (1) and (2) exit from the surface 2012 after being incident on the recesses 21 during the propagation within the light guide layer 201. And the light (3) is not incident on the recess 21, so that the light (3) can continue to propagate forward.

Figure 6B:
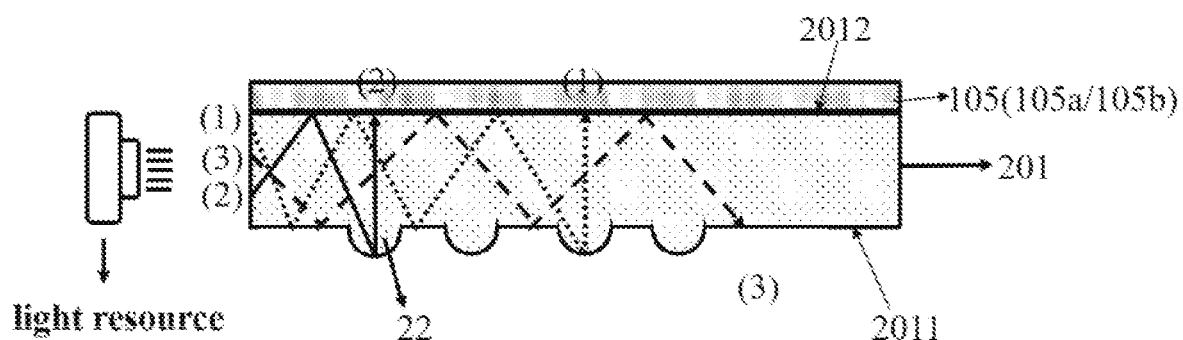
FIG. 6B shows a schematic diagram of a cross-sectional structure of light guide layer with protrusions according to an embodiment of the present disclosure.

FIG. 6B shows a schematic diagram of a cross-sectional structure of light guide layer with protrusions according to an embodiment of the present disclosure. It should be noted that the structure of FIG. 6B is based on the light guide layer in the structure of FIG. 4.

As shown in FIG. 6B, the surface 2011 of the light guide layer 201 away from the first adhesive layer 105 has protrusions 22. Similar to FIG. 6A, in FIG. 6B, the protrusion 22 can guide light to exit from the surface 2012 of the light guide layer 201 close to the photocurable material layer 105a, thereby curing the photocurable material layer 105a to form the photo-cured layer 105b. The other descriptions of FIG. 6B are similar to those of FIG. 6A, and will not be repeated here.

In addition, in an embodiment of the present disclosure, in the case that the light guide layer 201 shown in FIG. 4 does not have openings, providing the protrusions 22 in the light guide layer 201 can also avoid crosscolor phenomenon between different light emitting regions during displaying. Specifically, the protrusion 22 within the light emitting region A can further converge the light emitted from the first light emitting device 103 in the display substrate 10, so that the light can be restricted within the light emitting region A where the protrusions 22 are located.

In an exemplary embodiment of the present disclosure, the light guide layer 201 in the structure of FIG. 5A may also have at least one of the recess 21 and the protrusion 22 as shown in FIGS. 6A and 6B to effectively cure the photocurable material layer 105a. For the description of the recess 21 and the protrusion 22, reference can be made to FIGS. 6A and 6B, which will not be repeated here. On the basis of any of the foregoing embodiments regarding the light guide layer, the display panel may further include a second adhesive layer located on a side of the light guide layer away from the first adhesive layer.

For example, the display panel 1 may further include a second adhesive layer 200 located on a side of the light guide layer 201 away from the first adhesive layer 105 for adhering the light guide layer 201 to one of the display substrate 10 and the opposite substrate 20.

In an embodiment of the present disclosure, the second adhesive layer 200 may also include a photo-cured layer formed by curing a photocurable material layer. The second adhesive layer 200 may employ the same or different material as the first adhesive layer 105.

In addition, in an embodiment of the present disclosure, the second adhesive layer 200 may include a non-photocurable optical transparent glue. In this case, the thickness of the first adhesive layer 105 is less than the thickness of the second adhesive layer 200. As an example, the thickness of the first adhesive layer 105 is 6-50 μm, and the thickness of the second adhesive layer 200 is 50-300 μm. For example, the thickness of the second adhesive layer 200 is 100 μm.

Figure 8:
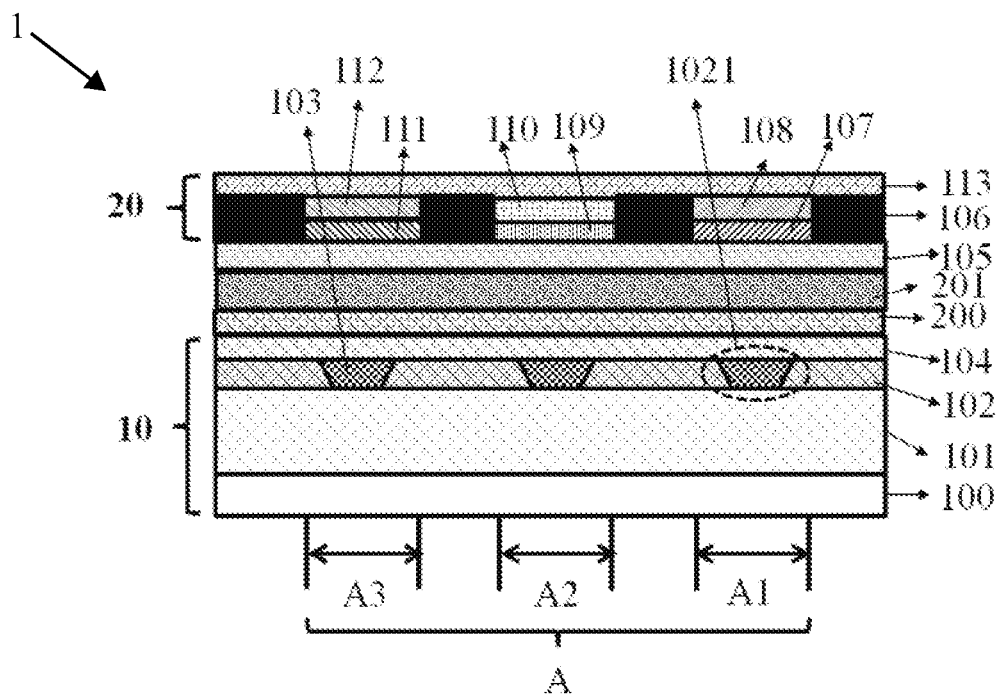
FIG. 8 shows a schematic diagram of a cross-sectional structure of a display panel according to an embodiment of the present disclosure.

FIG. 4 shows the case of the light guide layer 201 being adhered to the opposite substrate 20 by the second adhesive layer 200. FIG. 8 shows the case of the light guide layer 201 being adhered to the display substrate 20 by the second adhesive layer 200.

In an exemplary embodiment of the present disclosure, a material of the second adhesive layer 200 may include silicone rubber, acrylic resin, unsaturated polyester resin, urethane resin, or epoxy resin.

In an exemplary embodiment of the present disclosure, the refractive index of the second adhesive layer 200 is less than the refractive index of the light guide layer 201. In an exemplary embodiment of the present disclosure, the refractive index of the photocurable material layer 105a is less than the refractive index of the light guide layer 201. Therefore, during the manufacturing of the display panel, this relationship of refractive index enables the light incident from the side face into the light guide layer 201 to propagate within the light guide layer 201 via total reflection, which is beneficial for the light to reach the entire photocurable material layer 105a, thereby curing it to form the photocured layer 105b and thus achieving a better joining effect.

In an exemplary embodiment of the present disclosure, a range of the refractive index of the light guide layer 201 may be 1.5-2.0. As an example, the refractive index of the light guide layer 201 may be 1.84.

In an exemplary embodiment of the present disclosure, a range of the refractive index of the photocurable material layer 105a (i.e., the refractive index of the material before curing of the first adhesive layer 105) may be 1.42-1.51. As an example, the refractive index of the photocurable material layer 105a may be 1.50.

In an exemplary embodiment of the present disclosure, a range of the refractive index range of the photo-cured layer 105b (i.e., the first adhesive layer 105) may be 1.45-1.68. As an example, the refractive index of the first adhesive layer 105 may be 1.53.

In an exemplary embodiment of the present disclosure, a range of the refractive index of the second adhesive layer 200 may be 1.35-1.59. As an example, the refractive index of the second adhesive layer 200 may be 1.50.

In an exemplary embodiment of the present disclosure, in a case where the light guide layer 201 has openings 202, the opening 202 of the light guide layer 201 may be filled with a transparent resin or a material of the first adhesive layer 105. In an exemplary embodiment of the present disclosure, as an example, the refractive index of the transparent resin is less than the refractive index of the light guide layer 201. Therefore, in the process of manufacturing the display panel, the refractive index relationship makes the light being reflected (for example, totally reflected) at the interface between the light guide layer 201 and the transparent resin in the opening 202 or the interface between the light guide layer 201 and the material of the first adhesive layer 105 in the opening 202, thereby facilitating light propagation in the light guide layer 201. Specifically, when the reflected light propagates to the interface between the light guide layer 201 and the opening 202, a part of the light is emitted from the interface, and a part of the light is reflected by the interface back into the light guide layer 201 to continue to propagate within the light guide layer 201. The emitted light can be used to cure the material of the first adhesive layer 105. When the reflected light encounters the protrusions 22 or recesses 21 (if present) in the light guide layer 201, it will be reflected out of the light guide layer 201 by the protrusions 22 or recesses 21, thereby curing the material of the first adhesive layer 105. In an exemplary embodiment of the present disclosure, the material of the transparent resin may include an epoxy resin material. In an exemplary embodiment of the present disclosure, the refractive index of the transparent resin may be about 1.51.

In an embodiment of the present disclosure, referring to FIG. 4, when the refractive index differences between the light guide layer 201 and the photocurable material layer 105a (i.e., the material state of the first adhesive layer 105 before curing) and between the light guide layer 201 and the second adhesive layer 200 are small, it is not beneficial for restricting the propagation of light within the light guide layer during the joining process, which is not beneficial for the curing of part of the photocurable material layer 105a far away from the light source and thus affects the adhesion effect of the first adhesive layer 105.

On this basis, in order to restrict the propagation of light within the light guide layer as much as possible, according to an embodiment of the present disclosure, the display panel may further include a first cladding layer located between the light guide layer and the photocurable material layer, and a second cladding layer located between the light guide layer and the second adhesive layer.

Figure 7:
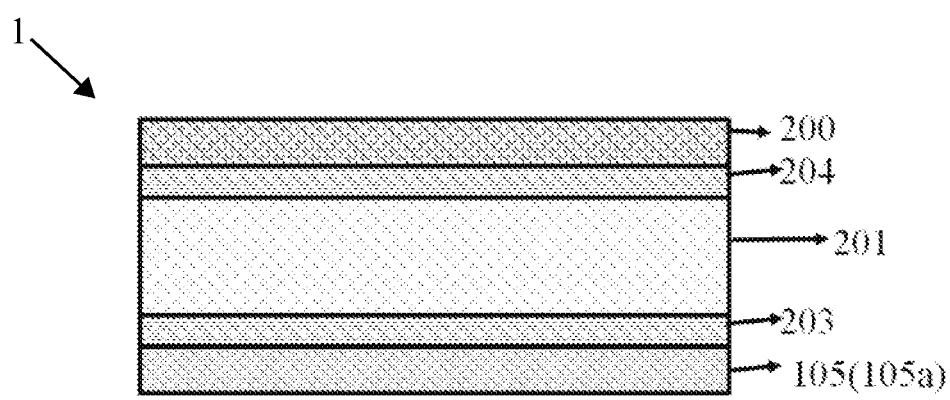
FIG. 7 shows a schematic diagram of a cross-sectional structure of partial structure of a display panel according to an embodiment of the present disclosure.

FIG. 7 shows a schematic diagram of a cross-sectional structure of a partial structure of a display panel according to an embodiment of the present disclosure. As shown in FIG. 7, the display panel 1 may further include: a first cladding layer 203 located between the light guide layer 201 and the first adhesive layer 105; and a second cladding layer 204 located between the light guide layer 201 and the second adhesive layer 200.

In an exemplary embodiment of the present disclosure, the refractive index of the first cladding layer 203 is less than the refractive index of the first adhesive layer 105 and the refractive index of the second cladding layer 204 is less than the refractive index of the second adhesive layer 200.

It should be noted that, according to the above, the refractive index of the material before curing of the first adhesive layer 105 (that is, the photocurable material layer 105a) is also greater than that of the first cladding layer 203.

Compared with the structure without the first cladding layer 203 and the second cladding layer 204 (for example, the structure of FIG. 4), in the structure of FIG. 7, the refractive index differences between the first cladding layer 203 and the light guide layer 201 and between the second cladding layer 204 and the light guide layer 201 are greater than the refractive index differences between the photocurable material layer 105a and the light guide layer 201 and between the second adhesive layer 200 and the light guide layer 201. Therefore, the total reflections of light at the interface between the first cladding layer 203 and the light guide layer 201 and at the interface between the second cladding layer 204 and the light guide layer 201 are more easily to achieve, which is helpful for the propagation of light with the light guide layer 201. Therefore, part of the photocurable material layer 105a far away from the light source can also be fully cured, thereby improving the joining effect.

In an exemplary embodiment of the present disclosure, the material of the first cladding layer 203 and the second cladding layer 204 may include epoxy resin, polymethyl methacrylate, or silica gel.

In an exemplary embodiment of the present disclosure, a range of the refractive index of the first cladding layer 203 and the second cladding layer 204 may be 1.05-1.5. As an example, the refractive index of the first cladding layer 203 and the second cladding layer 204 may be 1.38.

In an exemplary embodiment of the present disclosure, a range of the thickness of the first cladding layer 203 and the second cladding layer 204 may be 10-100 μm. As an example, the thickness of the first cladding layer 203 and the second cladding layer 204 may be 20 μm.

In an exemplary embodiment of the present disclosure, a range of the thickness of the light guide layer 201 may be 50-200 μm. As an example, the thickness of the light guide layer 201 may be 100 μm.

It can be understood that the first cladding layer 203 and the second cladding layer 204 can be applied to the structure of any one of the embodiments including the foregoing light guide layer, and details are not described herein again.

In an exemplary embodiment of the present disclosure, in one aspect, the light guide layer may be located on a side of the first adhesive layer facing the opposite substrate.

For example, referring to FIG. 4, the light guide layer 201 is located on the side of the first adhesive layer 105 facing the opposite substrate 20.

In an exemplary embodiment of the present disclosure, on the other hand, the light guide layer may be located on a side of the first adhesive layer facing the display substrate.

For example, referring to FIG. 8, the light guide layer 201 is located on the side of the first adhesive layer 105 facing the display substrate 10.

In an exemplary embodiment of the present disclosure, referring to FIG. 8, the opposite substrate 20 may include a first substrate 113, a black matrix 106 located on a side of the first substrate 113 facing the display substrate 10 for defining light emitting region A of the display panel, and a color block located on the side of the first substrate 113 facing the display substrate 10 and located within the light emitting region A.

In an exemplary embodiment of the present disclosure, with continued reference to FIG. 8, the light emitting regions A may include a first sub-light emitting region A1, a second sub-light emitting region A2, and a third sub-light emitting region A3. In an exemplary embodiment of the present disclosure, the color block may include a red color block located within the first sub-light emitting region A1, a green color block located within the second sub-light emitting region A2, and a blue color block located within the third sub-light emitting region A3. As an example, the red color block may include a red color film 108 located on the first substrate 113 and a red quantum dot layer 107 located on the red color film 108. As an example, the green color block may include a green color film 110 located on the first substrate 113 and a green quantum dot layer 109 located on the green color film 110. As an example, the blue color block may include a blue color film 113 located on the first substrate 113 and a scattering particle layer 111 located on the blue color film 112.

It can be understood that, when the display panel is displaying, the light emitting device 103 in the display substrate may emit blue light, for example. When the blue light is irradiated to the red quantum dot layer 107, the green quantum dot layer 109 and the scattering particle layer 111, a red light, a green light and a blue light can be obtained respectively for color displaying.

In an exemplary embodiment of the present disclosure, the display substrate 10 may be a display substrate including light emitting device such as an OLED.

Specifically, with continued reference to FIG. 8, the display substrate 10 may include a second substrate 100, a thin film transistor 101 located on a side of the second substrate 100 facing the opposite substrate 20, a pixel definition layer 102 located on the thin film transistor 100, the pixel definition layer 102 having openings 1021, and each opening 1021 of the pixel definition layer 102 being located within a corresponding one of the light emitting regions A, a first light emitting device 103 located on the thin film transistor 101 and located within each opening 1021 of the pixel definition layer 102, and an encapsulation layer 104 located on the pixel definition layer 102 and the first light emitting device 103.

Although the thin film transistor is shown as one layer, it should be understood that the layer 101 may include a plurality of thin film transistors for driving the first light emitting device 103. As an example, a thin film transistor may include a gate electrode, a gate insulating layer, an active layer, and a source/drain electrode layer.

Although the specific structure of the first light emitting device 103 (for example, OLED) is not shown in FIG. 8, it should be understood that the first light emitting device 103 may include an anode layer, light emitting layer, and a cathode layer. As an example, the first light emitting device 103 may emit blue light, for example.

In an exemplary embodiment of the present disclosure, on the other hand, the display substrate 10 may be a liquid crystal-based display substrate that emits light using LEDs.

Figure 9:
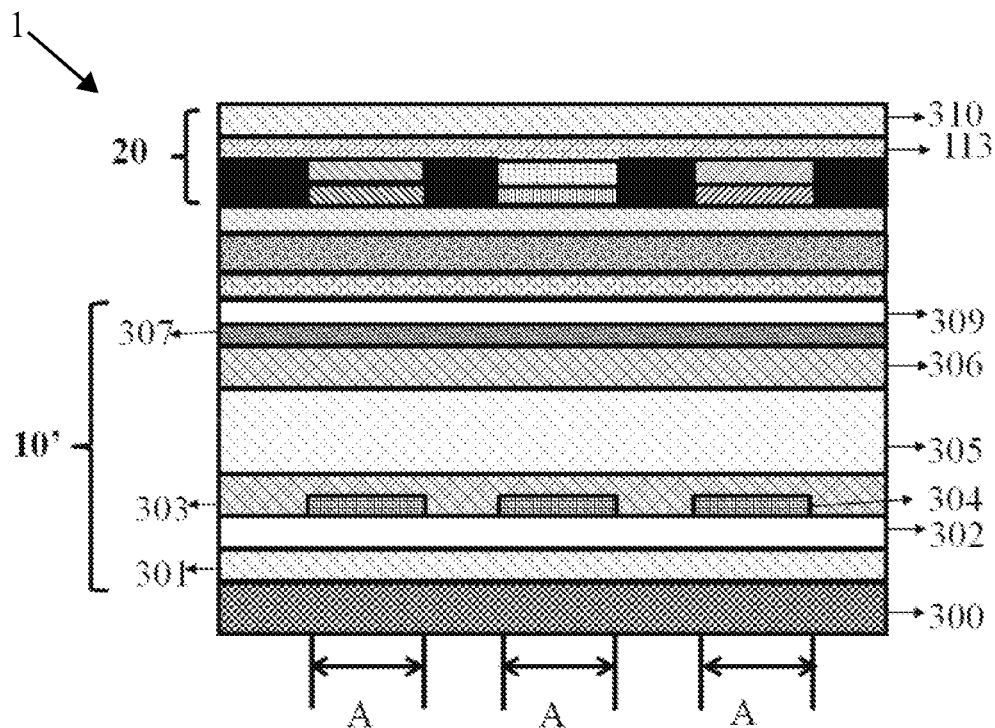
FIG. 9 shows a schematic diagram of a cross-sectional structure of a display panel according to an embodiment of the present disclosure.

Specifically, referring to FIG. 9, the display substrate 10' may include a third substrate 302 and a fourth substrate 309 opposite to each other, a liquid crystal layer 305 located between the third substrate 302 and the fourth substrate 309, a first alignment layer 303 located on a side of the third substrate 302 facing the liquid crystal layer 305, a second alignment layer 306 on a side of the fourth substrate 309 facing the liquid crystal layer 305, a pixel electrode 304 located between the third substrate 302 and the first alignment layer 303 and located within the light emitting regions A, the thin film transistor (not shown) located between the third substrate 302 and the pixel electrode 304, and a common electrode 307 located between the fourth substrate 309 and the second alignment layer 306. In an exemplary embodiment of the present disclosure, the common electrode 307 may also be located between the third substrate 302 and the pixel electrode 304 (the positional relationship is not shown). In this case, the display substrate further includes a dielectric layer located between the pixel electrode and the common electrode.

In an exemplary embodiment of the present disclosure, the display substrate 10' may further include a first polarizer 301 located on a side of the third substrate 302 away from the first alignment layer 303, and a second light emitting device 300 located on a side of the first polarizer 301 away from the third substrate 302. As an example, the second light emitting device 300 may be an LED. As an example, the second light emitting device 300 may emit blue light.

In an exemplary embodiment of the present disclosure, the opposite substrate 20 may further include a second polarizer 310 on a side of the first substrate 113 away from the display substrate 10'.

In the embodiments of the present disclosure, a method for manufacturing a display panel is also provided, so that other devices of the display panel would not be damaged while ensuring that the photocurable material layer is effectively cured, thereby not only providing a good encapsulation effect and would not adversely affect the display panel.

Figure 10:
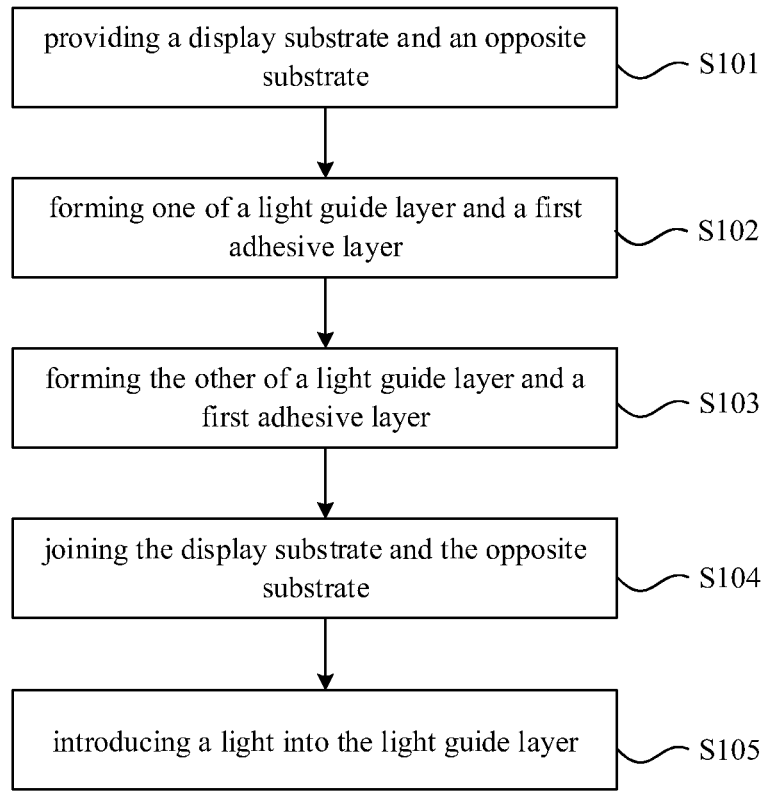
FIG. 10 shows a flowchart of a method for manufacturing a display panel according to an embodiment of the present disclosure.

FIG. 10 shows a flowchart of a method for manufacturing a display panel according to an embodiment of the present disclosure. As shown in FIG. 10, in an embodiment of the present disclosure, the method for manufacturing a display panel includes steps S101 to S105.

Hereinafter, a method for manufacturing a display panel according to an embodiment of the present disclosure will be described with reference to FIGS. 11 to 16.

Figure 11:
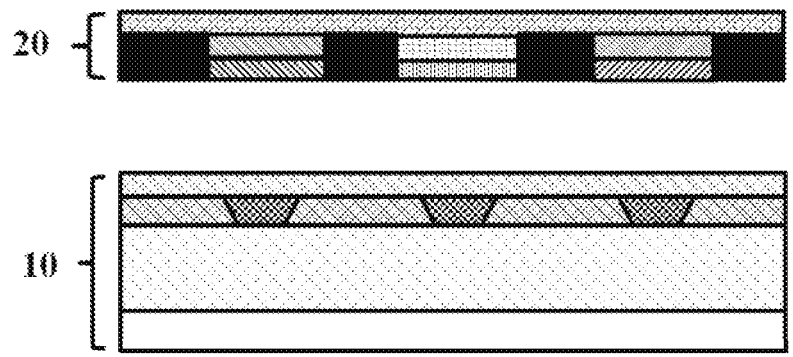
FIGS. 11 to 16 show schematic views of cross-sectional structures of a method for manufacturing a display panel according to an embodiment of the present disclosure.

Referring to FIG. 11, in step S101, a display substrate 10 and an opposite substrate 20 are provided.

In steps S102 and S103, one of light guide layer and a first adhesive layer is formed, and the other of the light guide layer and the first adhesive layer is formed.

Figure 12A:
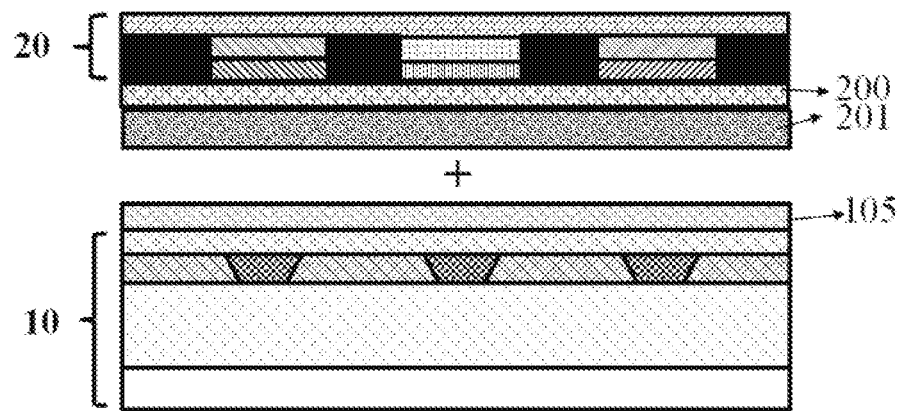

As an example, referring to FIG. 12A, steps S102 and S103 may include providing a first adhesive layer 105 including a photocurable material on the display substrate 10, and providing light guide layer 201 on the opposite substrate 20. It should be noted that, in this embodiment, the material of the first adhesive layer 105 is in a state before curing, that is, it can be expressed as the photocurable material layer 105a in the foregoing embodiment.

Figure 12B:
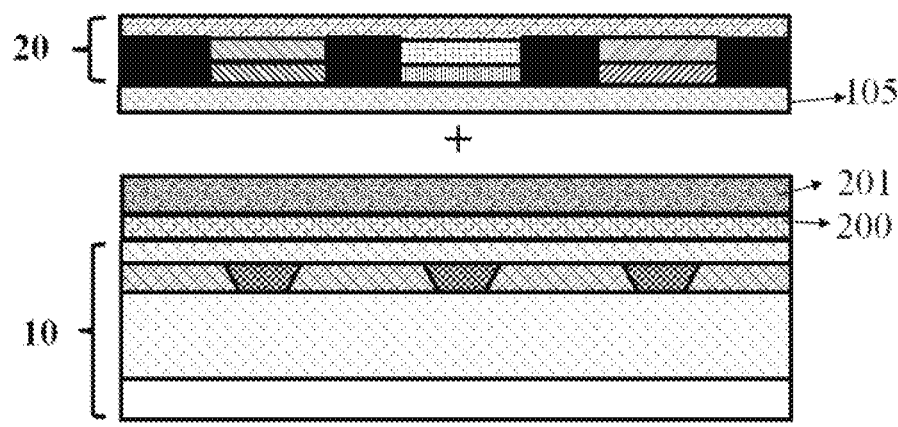

As another example, referring to FIG. 12B, steps S102 and S103 may include: providing light guide layer 201 on the display substrate 10, and providing a first adhesive layer 105 on the opposite substrate 20.

It should be noted that, as shown in FIGS. 12A and 12B, before the light guide layer 201 is provided, a second adhesive layer 200 needs to be provided on the display substrate 10 or the opposite substrate 20 to adhere the light guide layer 201 to the display substrate 10 or the opposite substrate 20.

It should be noted that the light guide layer 201 according to an embodiment of the present disclosure may be separately prepared. In an embodiment of the present disclosure, the light guide layer 201 may be formed on the display substrate 10 or the opposite substrate 20 by, for example, attaching. It can be understood that the description of the structure, material, thickness, etc. of the light guide layer 201 in this embodiment can refer to the embodiments described above with respect to FIGS. 4 to 9, and details are not described herein again.

In addition, referring to FIG. 7, before the light guide layer 201 is provided, a first cladding layer 203 and a second cladding layer 204 are respectively formed on both sides of the light guide layer 201. In an embodiment of the present disclosure, the light guide layer 201 is provided such that the first cladding layer 203 is located between the light guide layer 201 and the first adhesive layer 105 and the second cladding layer 204 is located between the light guide layer 201 and the second adhesive layer 105. In an exemplary embodiment of the present disclosure, the refractive index of the first cladding layer 203 is less than the refractive index of the first adhesive layer 105, and the refractive index of the second cladding layer 204 is less than the refractive index of the second adhesive layer 200. It should be noted that for other descriptions of the first cladding layer 203 and the second cladding layer 204, reference may be made to the embodiment described above with respect to FIG. 7, which will not be repeated here.

In addition, it can be understood that the description of the material, thickness, etc. of the first adhesive layer 105 in this embodiment can refer to the photocurable material layer 105a in the embodiments described above with respect to FIGS. 4-9, which will not be repeated here.

In step S104, the display substrate and the opposite substrate are joined.

Specifically, on the basis of FIG. 12A or FIG. 12B, the display substrate 10 and the opposite substrate 20 are joined so that the light guide layer 201 and the first adhesive layer 105 are located between the display substrate 10 and the opposite substrate 20 and are stacked on each other. Thus, the structure as shown in FIG. 4 or FIG. 8 is obtained.

In step S105, light is directed into the light guide layer.

Figure 13:
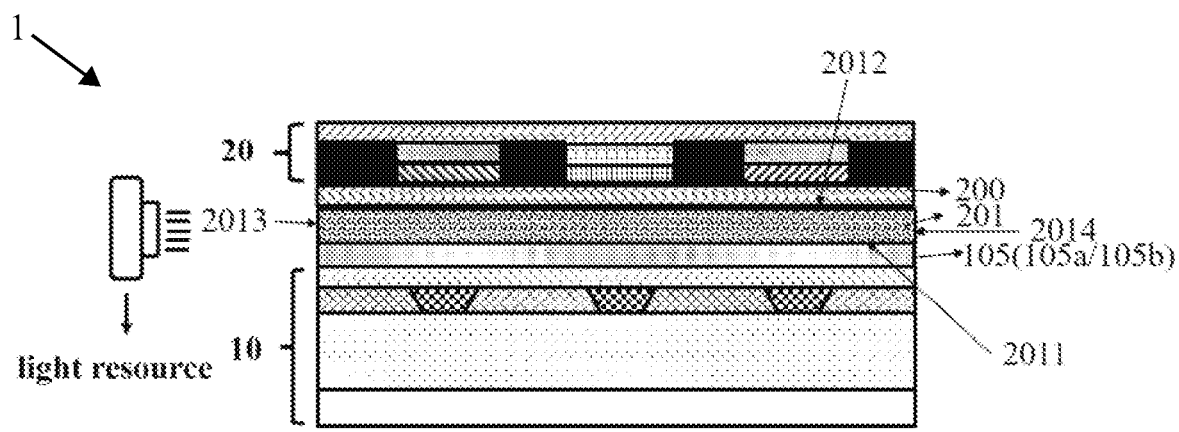

For example, step S105 is described based on the structure of FIG. 4. Specifically, as shown in FIG. 13, light is directed into the light guide layer 201 from the side face 2013 of the light guide layer 201 to cure the photocurable material layer 105a included in the first adhesive layer, thereby forming the photo-cured layer 105b. In an exemplary embodiment of the present disclosure, the side face 2013 is located between a first face 2011 and a second face opposite to each other of the light guide layer 201 that are parallel to the displaying side of the display panel 1 (for example, the side of the opposite substrate 20 away from the display substrate 10). As another example, light may also be directed into the light guide layer 201 from the side face 2014.

In the embodiment of the present disclosure, the light can cure the photocurable material layer 105a to obtain the photo-cured layer 105b, so that the performance of the thin film transistor in the display substrate 10 would not be affected and the luminous efficiency of the quantum dot material in the opposite substrate 20 would not be affected.

In an exemplary embodiment of the present disclosure, the above-mentioned light may include ultraviolet light, for example.

In an exemplary embodiment of the present disclosure, the material of the photocurable material layer may include an ultraviolet light curable material.

It should be noted that the description of step S105 based on the structure of FIG. 8 is similar to the above description based on the structure of FIG. 4 and will not be repeated here.

The specific method for providing the display substrate and the opposite substrate included in step S101 is described below.

Firstly, a specific method for providing the opposite substrate is described with reference to FIG. 14.

Figure 14:
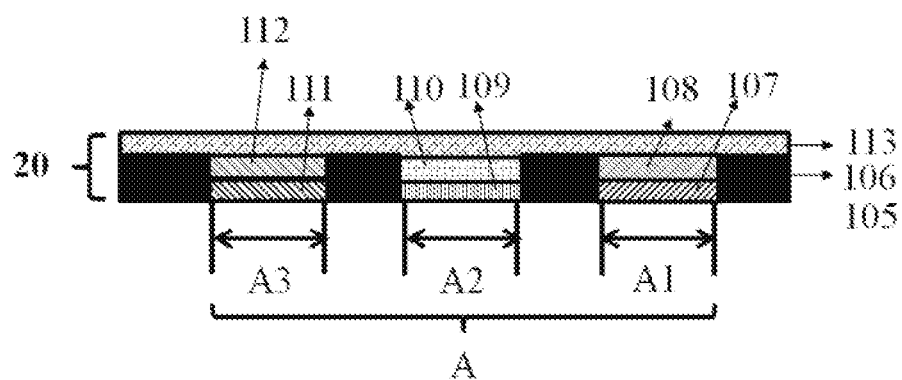

In an exemplary embodiment of the present disclosure, referring to FIG. 14, providing the opposite substrate 20 includes providing a first substrate 113, forming a black matrix material layer on the first substrate 113, and patterning the black matrix material layer to form a black matrix 106, the black matrix 106 defining light emitting region A of the display panel, and forming a color block within the light emitting region A and on the first substrate 113.

In an exemplary embodiment of the present disclosure, continuing to refer to FIG. 14, the light emitting region A may include a first sub-light emitting region A1, a second sub-light emitting region A2, and a third sub-light emitting region A3.

In an exemplary embodiment of the present disclosure, forming a color block may include forming a red color block within the first sub-light emitting region A1, forming a green color block within the second sub-light emitting region A2, and forming a blue color block within the third sub-light emitting region A3.

Specifically, referring to FIG. 14, in an exemplary embodiment of the present disclosure, forming a red color block may include forming a red color film 108 on the first substrate 113 and forming a red quantum dot layer 107 on the red color film 108. In an exemplary embodiment of the present disclosure, forming a green color block includes forming a green color film 110 on the first substrate 113 and forming a green quantum dot layer 109 on the green color film 110. In an exemplary embodiment of the present disclosure, forming a blue color block includes forming a blue color film 112 on the first substrate 113 and forming a scattering particle layer 111 on the blue color film 112. It should be noted that the display panel of the present disclosure can employ a blue backlight source, so the scattering particle layer 111 is formed on the blue color film 112. Those skilled in the art can determine the formation of the quantum dot layer or the scattering particle layer according to the color of the light emitted by the backlight source.

It can be understood that when the display panel is displaying, the light source of the display panel emits blue light. When the blue light is irradiated to the red quantum dot layer 107, the green quantum dot layer 109 and the scattering particle layer 111, a red light, a green light and a blue light can be obtained, respectively, for color displaying.

Next, a method for providing a display substrate is described.

On one hand, a method for providing a display substrate including light emitting device of an OLED is described with reference to FIG. 15.

Figure 15:
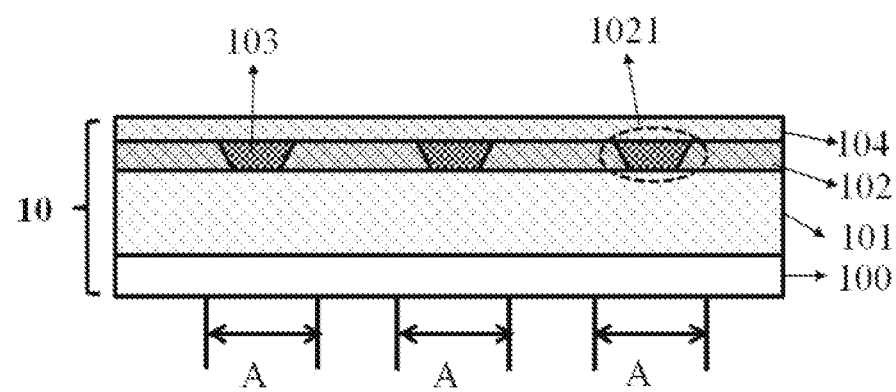

In an exemplary embodiment of the present disclosure, referring to FIG. 15, a method for providing a display substrate 10 may include providing a second substrate 100, forming a thin film transistor 101 on the second substrate 100, forming a pixel definition material layer on the thin film transistor 101, patterning the pixel definition material layer to form openings 1021 in the pixel definition material layer, thereby forming a pixel definition layer 102 having openings 1021 and each opening 1021 of the pixel definition layer 102 is located within a corresponding one of the light emitting regions A of the display panel, and forming a first light emitting device 103 in each opening 1021 of the pixel definition layer 102 and on the thin film transistor 101, and forming an encapsulation layer 104 on the pixel definition layer 102 and the first light emitting device 103.

Although the thin film transistor is shown as one layer, it should be understood that the layer 101 may include a plurality of thin film transistors for driving the first light emitting device 103. As an example, forming a thin film transistor may include sequentially forming a gate electrode, a gate insulating layer, an active layer, and a source/drain electrode layer.

It should be understood that forming the first light emitting device 103 such as an OLED may include sequentially forming an anode layer, light emitting layer, and a cathode layer. As an example, the first light emitting device 103 may emit blue light, for example.

On the other hand, a method for providing a display substrate including light emitting device of an LED is described with reference to FIG. 16.

Figure 16:
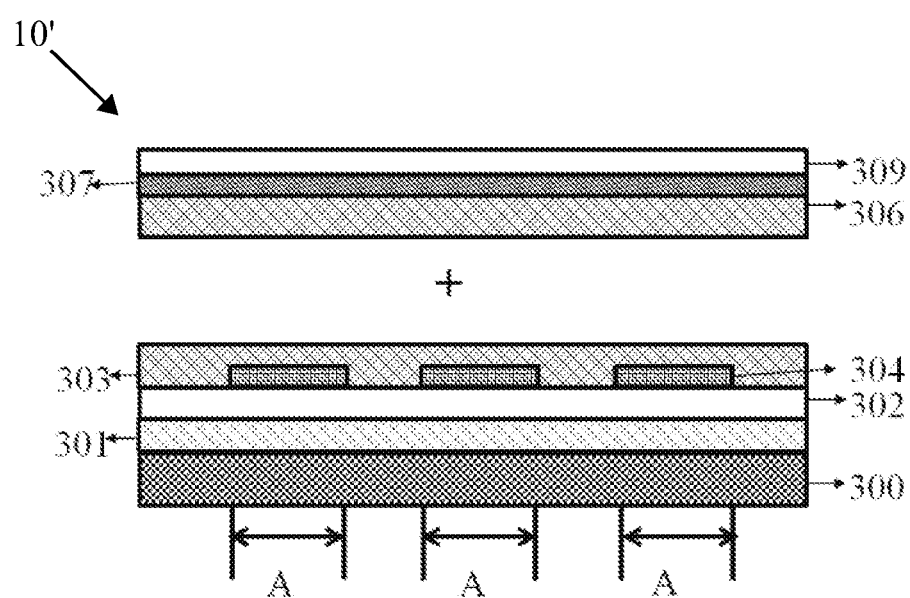

In an exemplary embodiment of the present disclosure, referring to FIG. 16, providing a display substrate 10' may include providing a third substrate 302, forming a thin film transistor (not shown) on the third substrate 302, forming a pixel electrode material layer on the thin film transistor, patterning the pixel electrode material layer to form the pixel electrode 304 located within the light emitting region A of the display panel, and forming a first alignment layer 303 on the pixel electrode 304.

In an exemplary embodiment of the present disclosure, providing the display substrate 10' may further include forming a first polarizer 301 on a surface of the third substrate 302 away from the first alignment layer 304, and forming a second light emitting device 300 on the first polarizer 301. As an example, the second light emitting device 300 may emit blue light, for example.

In an exemplary embodiment of the present disclosure, providing the display substrate 10' may further include providing a fourth substrate 309, and forming a second alignment layer 306 on the fourth substrate 309.

In an exemplary embodiment of the present disclosure, as an example, providing the display substrate 10' may further include before forming the second alignment layer 306, forming a common electrode layer 307 on the fourth substrate 309, as shown in FIG. 16. As another example, before forming the thin film transistor, a common electrode layer may be formed on the third substrate 302 and a dielectric layer may be formed on the common electrode layer. This example is not shown in the figure, but it is understood that this example is part which is protected by the embodiment of the present disclosure.

In an exemplary embodiment of the present disclosure, providing the display substrate 10' may further include joining the third substrate 302 and the fourth substrate 309 so that the first alignment layer 303, the thin film transistor, the pixel electrode 304, the common electrode 307, and the second alignment layer 306 are located between the third substrate 302 and the fourth substrate 309, and providing liquid crystal between the second alignment layer 306 and the pixel electrode 304 and the first alignment layer 303. Thus, the display substrate 10' shown in FIG. 9 is obtained.

In addition, in the case where the display substrate is the display substrate 10' shown in FIG. 9, referring to FIG. 9, providing the opposite substrate 20 may also include forming a second polarizer 310 on the side of the first substrate 113 away from the display substrate 10'.

The foregoing description of the embodiment has been provided for purpose of illustration and description. It is not intended to be exhaustive or to limit the application. Even if not specifically shown or described, individual elements or features of a particular embodiment are generally not limited to that particular embodiment, are interchangeable when under a suitable condition, can be used in a selected embodiment and may also be varied in many ways. Such variations are not to be regarded as a departure from the application, and all such modifications are included within the scope of the application.

What is claimed is:

1. A display panel comprising:
   a display substrate;
   an opposite substrate; and
   a first adhesive layer and light guide layer located between the display substrate and the opposite substrate and stacked on each other,
   wherein the first adhesive layer comprises a photo-cured layer formed by curing a photocurable material layer, and wherein the light guide layer is used to direct light to the photocurable material layer during the curing to form the photo-cured layer.

2. The display panel according to claim 1, wherein the light guide layer comprises a plurality of openings, and each opening of the light guide layer is located within a corresponding one of light emitting regions of the display panel, respectively.

3. The display panel according to claim 2, wherein the opening of the light guide layer is filled with a transparent resin or a material of the first adhesive layer, and
   wherein a refractive index of the transparent resin and a refractive index of the material of the first adhesive layer are less than a refractive index of the light guide layer.

4. The display panel according to claim 1, wherein a surface of the light guide layer away from the first adhesive layer has at least one of a recess and a protrusion.

5. The display panel according to claim 1, further comprising a second adhesive layer located on a side of the light guide layer away from the first adhesive layer,
   wherein a refractive index of the second adhesive layer and a refractive index of the first adhesive layer are less than a refractive index of the light guide layer.

6. The display panel according to claim 5, further comprising a first cladding layer located between the light guide layer and the first adhesive layer; and
   a second cladding layer located between the light guide layer and the second adhesive layer, wherein a refractive index of the first cladding layer is less than a refractive index of the first adhesive layer, and wherein a refractive index of the second cladding layer is less than the refractive index of the second adhesive layer.

7. The display panel according to claim 1, wherein the light guide layer is located on a side of the first adhesive layer facing the display substrate.

8. The display panel according to claim 1, wherein the light guide layer is located on a side of the first adhesive layer facing the opposite substrate.

9. The display panel according to claim 1, wherein the opposite substrate comprises:
a first substrate;
a black matrix located on a side of the first substrate facing the display substrate for defining light emitting region of the display panel; and
a color block located on the side of the first substrate facing the display substrate and located within the light emitting region.

10. The display panel according to claim 9, wherein the light emitting region comprises a first sub-light emitting region, a second sub-light emitting region, and a third sub-light emitting region,
wherein the color block comprises a red color block located within the first sub-light emitting region, a green color block located within the second sub-light emitting region, and a blue color block located within the third sub-light emitting region,
wherein the red color block comprises a red color film located on the first substrate and a red quantum dot layer located on the red color film,
wherein the green color block comprises a green color film located on the first substrate and a green quantum dot layer located on the green color film, and
wherein the blue color block comprises a blue color film located on the first substrate and a scattering particle layer located on the blue color film.

11. The display panel according to claim 9, wherein the display substrate comprises:
a second substrate;
a thin film transistor located on a side of the second substrate facing the opposite substrate;
a pixel definition layer located on the thin film transistor, the pixel definition layer having openings, and each opening of the pixel definition layer located within a corresponding one of the light emitting regions;
a first light emitting device located on the thin film transistor and located in each opening of the pixel definition layer; and
an encapsulation layer located on the pixel definition layer and the first light emitting device.

12. The display panel according to claim 9, wherein the display substrate comprises:
a third substrate and a fourth substrate disposed oppositely;
a liquid crystal layer located between the third substrate and the fourth substrate;
a first alignment layer located on a side of the third substrate facing the liquid crystal layer;
a second alignment layer located on a side of the fourth substrate facing the liquid crystal layer;
a pixel electrode located between the third substrate and the first alignment layer and located within the light emitting region of the display panel;
a thin film transistor located between the third substrate and the pixel electrode; and
a dielectric layer located between the third substrate and the pixel electrode and a common electrode located between the third substrate and the dielectric layer, or
a common electrode located between the fourth substrate and the second alignment layer.

13. A method for manufacturing a display panel, the method comprising:
providing a display substrate and an opposite substrate;
providing one of a light guide layer and a first adhesive layer comprising a photocurable material on the display substrate or the opposite substrate;
providing the other of the light guide layer and the first adhesive layer on the display substrate or the opposite substrate;
joining the display substrate and the opposite substrate so that the light guide layer and the first adhesive layer are located between the display substrate and the opposite substrate and are stacked on each other; and
directing light from a side face of the light guide layer into the light guide layer to cure the photocurable material comprised in the first adhesive layer, thereby forming a photo-cured layer,
wherein the side face is located between a first face and a second face opposite to each other of the light guide layer that are parallel to a display side of the display panel.

14. The method according to claim 13, wherein providing one of a light guide layer and a first adhesive layer comprising a photocurable material on the display substrate or the opposite substrate and providing the other of the light guide layer and the first adhesive layer on the display substrate or the opposite substrate comprises:
providing the light guide layer on the display substrate; and
providing the first adhesive layer comprising the photocurable material on the light guide layer.

15. The method according to claim 13, wherein providing one of a light guide layer and a first adhesive layer comprising a photocurable material on the display substrate or the opposite substrate comprises providing the first adhesive layer comprising the photocurable material on the display substrate, and
wherein providing the other of the light guide layer and the first adhesive layer on the display substrate or the opposite substrate comprises providing the light guide layer on the opposite substrate.

16. The method according to claim 13, wherein the light guide layer comprises openings, and each opening of the light guide layer is located within a corresponding one of the light emitting regions of the display panel, respectively.

17. The method according to claim 16, further comprising, after providing the light guide layer, filling the opening of the light guide layer with a transparent resin or a material of the first adhesive layer,
wherein a refractive index of the transparent resin and a refractive index of the material of the first adhesive layer are less than a refractive index of the light guide layer.

18. The method according to claim 13, wherein a surface of the light guide layer away from the first adhesive layer has at least one of a recess and a protrusion.

19. The method according to claim 13, further comprising before providing the light guide layer, providing a second adhesive layer on the display substrate or the opposite substrate, wherein a refractive index of the first adhesive layer and a refractive index of the second adhesive layer are less than a refractive index of the light guide layer.

20. The method according to claim 19, further comprising before providing the light guide layer, forming a first cladding layer and a second cladding layer on both sides of the light guide layer, respectively, wherein the light guide layer is provided such that the first cladding layer is located between the light guide layer and the first adhesive layer, and wherein the second cladding layer is located between the light guide layer and the second adhesive layer, and wherein a refractive index of the first cladding layer is less than a refractive index of the first adhesive layer, and wherein a refractive index of the second cladding layer is less than a refractive index of the second adhesive layer.

* * * * *